(12) United States Patent
Bensahel et al.

(10) Patent No.: US 8,895,420 B2
(45) Date of Patent: Nov. 25, 2014

(54) METHOD OF FABRICATING A DEVICE WITH A CONCENTRATION GRADIENT AND THE CORRESPONDING DEVICE

(71) Applicant: STMicroelectronics (Crolles 2) SAS, Crolles (FR)

(72) Inventors: Daniel-Camille Bensahel, Grenoble (FR); Yves Morand, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/040,270

(22) Filed: Sep. 27, 2013

(65) Prior Publication Data

US 2014/0027886 A1    Jan. 30, 2014

Related U.S. Application Data

(62) Division of application No. 12/061,403, filed on Apr. 2, 2008, now Pat. No. 8,575,011.

(30) Foreign Application Priority Data

Apr. 3, 2007   (FR) ...................... 07 54226

(51) Int. Cl.
*H01L 29/36* (2006.01)
*H01L 21/22* (2006.01)
*H01L 21/02* (2006.01)
*H01L 21/3065* (2006.01)
*H01L 21/306* (2006.01)
*H01L 29/66* (2006.01)

(52) U.S. Cl.
CPC .......... *H01L 21/22* (2013.01); *H01L 21/02664* (2013.01); *H01L 21/0245* (2013.01); *H01L 21/3065* (2013.01); *H01L 21/30604* (2013.01); *H01L 21/02636* (2013.01); *H01L 21/02532* (2013.01); *H01L 29/66659* (2013.01); *H01L 21/02381* (2013.01); *H01L 29/36* (2013.01)
USPC ........... 438/561; 438/542; 438/549; 438/554; 438/558; 257/E21.135

(58) Field of Classification Search
CPC .............................. H01L 21/225; H01L 21/22
USPC .......................................... 438/555, 558, 561
See application file for complete search history.

(56) References Cited

U.S. PATENT DOCUMENTS

| | | | |
|---|---|---|---|
| 4,370,510 A | 1/1983 | Stirn | |
| 4,644,381 A | 2/1987 | Shieh | |
| 4,789,643 A | 12/1988 | Kajikawa | |
| 4,967,250 A | 10/1990 | Clark, Jr. et al. | |
| 4,992,841 A | 2/1991 | Halvis | |
| 5,040,032 A | 8/1991 | Kapon | |
| 5,114,877 A | 5/1992 | Paoli et al. | |

(Continued)

OTHER PUBLICATIONS

Preliminary French Search Report, FR 07 54226, dated Dec. 13, 2007.

*Primary Examiner* — Colleen A Matthews
*Assistant Examiner* — William Harriston
(74) *Attorney, Agent, or Firm* — Gardere Wynne Sewell LLP

(57) ABSTRACT

A semiconductive device is fabricated by forming, within a semiconductive substrate, at least one continuous region formed of a material having a non-uniform composition in a direction substantially perpendicular to the thickness of the substrate.

19 Claims, 5 Drawing Sheets

(56) References Cited

U.S. PATENT DOCUMENTS

| | | |
|---|---|---|
| 5,358,908 A | 10/1994 | Reinberg et al. |
| 5,378,309 A | 1/1995 | Rabinzohn |
| 5,420,051 A | 5/1995 | Bohr et al. |
| 5,516,724 A * | 5/1996 | Ast et al. .................. 438/541 |
| 5,528,615 A | 6/1996 | Shima |
| 5,577,062 A | 11/1996 | Takahashi |
| 5,714,777 A | 2/1998 | Ismail et al. |
| 5,770,475 A | 6/1998 | Kim et al. |
| 5,827,754 A | 10/1998 | Min et al. |
| 5,989,947 A | 11/1999 | Dilger et al. |
| 5,994,724 A | 11/1999 | Morikawa |
| 6,069,018 A | 5/2000 | Song et al. |
| 6,075,291 A | 6/2000 | Thakur |
| 6,096,626 A | 8/2000 | Smith et al. |
| 6,207,493 B1 | 3/2001 | Furukawa et al. |
| 6,228,750 B1 * | 5/2001 | Shibib ..................... 438/558 |
| 6,294,461 B1 | 9/2001 | Thakur |
| 6,399,502 B1 | 6/2002 | Hernandez et al. |
| 6,469,388 B1 | 10/2002 | Thakur |
| 6,503,801 B1 | 1/2003 | Rouse et al. |
| 6,703,688 B1 | 3/2004 | Fitzergald |
| 6,806,147 B1 | 10/2004 | Yu et al. |
| 6,879,044 B2 | 4/2005 | Thakur |
| 7,111,386 B2 | 9/2006 | Chen et al. |
| 7,115,895 B2 | 10/2006 | von Kanel |
| 7,141,866 B1 | 11/2006 | Islam et al. |
| 7,157,297 B2 | 1/2007 | Kamikawa et al. |
| 7,348,259 B2 | 3/2008 | Cheng et al. |
| 7,646,071 B2 | 1/2010 | Ban et al. |
| 7,649,232 B2 | 1/2010 | Tamura et al. |
| 7,719,036 B2 | 5/2010 | Wadsworth |
| 7,871,469 B2 | 1/2011 | Maydan et al. |
| 7,879,679 B2 | 2/2011 | Kermarrec et al. |
| 2003/0057555 A1 | 3/2003 | Thakur |
| 2003/0172866 A1 | 9/2003 | Hsu et al. |
| 2004/0159948 A1 | 8/2004 | Thakur |
| 2004/0183078 A1 | 9/2004 | Wang |
| 2005/0116226 A1 | 6/2005 | Von Kanel |
| 2005/0127275 A1 | 6/2005 | Yang |
| 2005/0170577 A1 | 8/2005 | Yao et al. |
| 2005/0211982 A1 | 9/2005 | Lei et al. |
| 2005/0285097 A1 | 12/2005 | Shang et al. |
| 2006/0079056 A1 | 4/2006 | Kim et al. |
| 2006/0110936 A1 | 5/2006 | Hill et al. |
| 2006/0113542 A1 | 6/2006 | Isaacson et al. |
| 2006/0134893 A1 | 6/2006 | Savage et al. |
| 2006/0220113 A1 | 10/2006 | Tamura et al. |
| 2006/0258123 A1 | 11/2006 | Forbes |
| 2007/0020874 A1 | 1/2007 | Xie et al. |
| 2007/0105274 A1 | 5/2007 | Fitzgerald |
| 2008/0001182 A1 | 1/2008 | Chen et al. |
| 2008/0119031 A1 | 5/2008 | Pal et al. |
| 2008/0169534 A1 | 7/2008 | Dip et al. |
| 2008/0239625 A1 | 10/2008 | Kermarrec et al. |
| 2008/0246121 A1 | 10/2008 | Bensahel et al. |
| 2008/0265256 A1 | 10/2008 | Lin et al. |
| 2008/0293214 A1 | 11/2008 | Williams et al. |
| 2009/0014878 A1 | 1/2009 | Cabral, Jr. et al. |
| 2009/0020879 A1 | 1/2009 | Lee et al. |
| 2009/0061287 A1 | 3/2009 | Larsen et al. |
| 2009/0250821 A1 | 10/2009 | Borthakur |
| 2009/0321717 A1 | 12/2009 | Pillarisetty et al. |
| 2010/0032812 A1 | 2/2010 | Sedky et al. |
| 2010/0164122 A1 | 7/2010 | Sakaki |

* cited by examiner

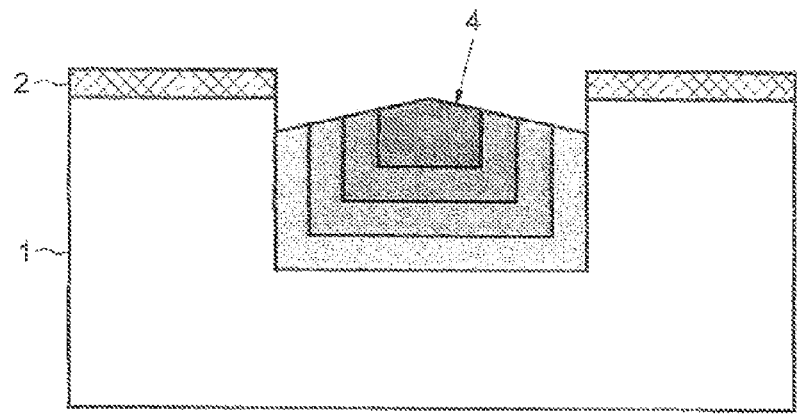
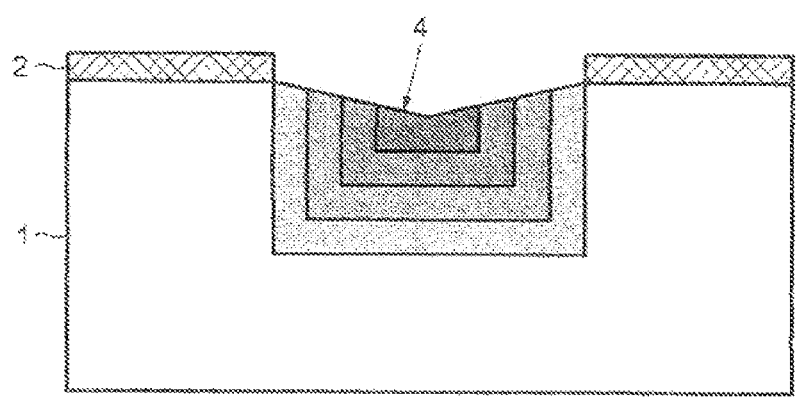

METHOD OF FABRICATING A DEVICE WITH A CONCENTRATION GRADIENT AND THE CORRESPONDING DEVICE

PRIORITY CLAIM

The present application is a divisional application of U.S. application for patent Ser. No. 12/061,403 filed on Apr. 2, 2008, which is a translation of and claims priority from French Application for Patent No. 07 54226 filed Apr. 3, 2007, the disclosures of which are hereby incorporated by reference.

BACKGROUND OF THE INVENTION

1. Technical Field of the Invention
The present invention relates to microelectronics.
2. Description of Related Art
Microelectronics is conventionally based on the production of planar devices.

Using only deposition techniques, it is possible to deposit successive layers of stratiform materials, in which the chemical composition varies from one layer to the next. This gives a vertical gradient if the variations of composition from one layer to the next are fairly slight.

Doping also makes it possible to vary the composition gradually inside a layer delimited by interfaces.

All these conventional techniques cause the creation of a vertical gradient of composition, that is to say parallel to the thickness of the substrate, well-suited to the conventional fabrication methods.

SUMMARY OF THE INVENTION

According to one embodiment, a structure that is dissymmetrical in the plane and no longer in thickness is proposed. A non-limiting example of an application is a sloping etching or else a compensation for the difficulties of etching.

According to one aspect, a method of fabricating a semiconductive device is proposed comprising the formation, within a semiconductive substrate, of at least one continuous region formed of a material having a non-uniform composition in a direction substantially perpendicular to the thickness of the substrate.

The continuous region may be formed of a material having a gradual variation of composition along the direction substantially perpendicular to the thickness of the substrate.

The formation of the continuous region may comprise, for example, the formation of zones of a semiconductive alloy having different compositions in a direction substantially perpendicular to the thickness of the substrate.

The formation of the zones of alloy may comprise, for example, the formation of successive layers of the alloy all extending at least partially in a direction substantially parallel to the thickness of the substrate and having respectively different compositions of the alloy.

The different compositions of the layers may form a gradient of concentrations of one of the components of the alloy.

The alloy may comprise silicon or germanium.

According to one embodiment, the formation of the continuous semiconductive region may comprise the formation of a cavity in the substrate and the formation, at least on the vertical walls of the cavity, of a stack of layers of the alloy having respectively different compositions of the alloy.

According to one embodiment, the substrate may be formed of one of the components of the alloy and the formation of the continuous semiconductive region may comprise the formation of a cavity in the substrate, the filling of the cavity by the alloy and a drive-in diffusion step in order to form, in a portion of the substrate adjacent to the cavity, successive layers of the alloy all extending in a direction substantially parallel to the thickness of the substrate and having respectively different compositions of the alloy.

According to one embodiment, a method may also comprise an etching of the top surface of the continuous region, the etching having different characteristics depending on the composition.

According to another aspect, a semiconductive device is proposed comprising, within a semiconductive substrate, at least one continuous region formed of a material having a non-uniform composition in a direction substantially perpendicular to the thickness of the substrate.

The continuous region may be formed of a material having a gradual variation of composition along the direction.

According to one embodiment, the continuous semiconductive region may comprise a semiconductive alloy having zones of different compositions in a direction substantially perpendicular to the thickness of the substrate.

The continuous semiconductive region may comprise, for example, successive layers of the alloy all extending at least partially parallel to the thickness of the substrate and having respectively different compositions of the alloy.

The different compositions of the zones or layers may form a gradient of concentrations of one of the components of the alloy.

The alloy may comprise silicon and germanium.

According to one embodiment, the top face of the continuous region may comprise a profile that is sloping relative to the top face of the substrate.

The top face of the continuous region may comprise, for example, a convex or concave profile.

In an embodiment, a semiconductive device comprises an alloy material layer having a thickness in a first direction and including a top surface, the alloy material layer having a non-uniform alloy material composition in a second direction which is substantially perpendicular to the first direction.

In an embodiment, a method comprises: forming a trench, and depositing a plurality of conformal layers in the trench, each layer formed of an alloy material, and each alloy material layer having a gradually differing material concentration so as to form a non-uniform composition in a direction substantially perpendicular to a depth of the trench.

In an embodiment, a method comprises: forming a trench in a layer of a first material, filling the trench with an alloy material comprising a combination the first material and a second material, the second material being present in the alloy material with a heavier concentration than the first material, and performing heat drive-in to stimulate lateral diffusion of the second material from the alloy material filling the trench and into the first material in the layer within which the trench is formed so as to form a non-uniform composition in a direction substantially perpendicular to a depth of the trench.

BRIEF DESCRIPTION OF THE DRAWINGS

Other advantages and features of the invention will appear on reading the detailed description, given only as a non-limiting example and made with reference to the appended drawings in which:

FIGS. 3 and 4 illustrate schematically examples of sloping etching;

DETAILED DESCRIPTION OF THE DRAWINGS

Although the invention is not limited to such a combination of materials, there follows a description of an embodiment using a silicon substrate with a silicon and germanium alloy.

Figure 1:
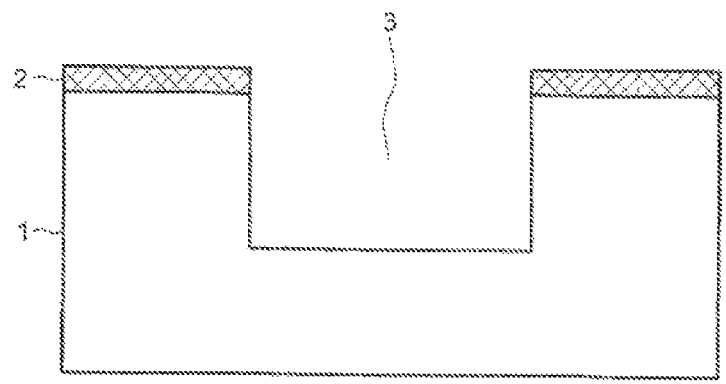
FIGS. 1 and 2 illustrate schematically the steps of one embodiment making it possible to obtain a horizontal gradient.

In FIG. 1, a protective layer 2 is deposited on the silicon substrate 1 in order to protect it when the cavity 3 is etched. This protective layer 2 may be deposited and formed by lithography in a manner that is conventional and known per se. The protective layer 2 may, for example, be a layer of silicon nitride $SiN_x$ or silicon oxide $SiO_2$. The protective layer may also be a layer of resin deposited in a thick layer.

Figure 2:
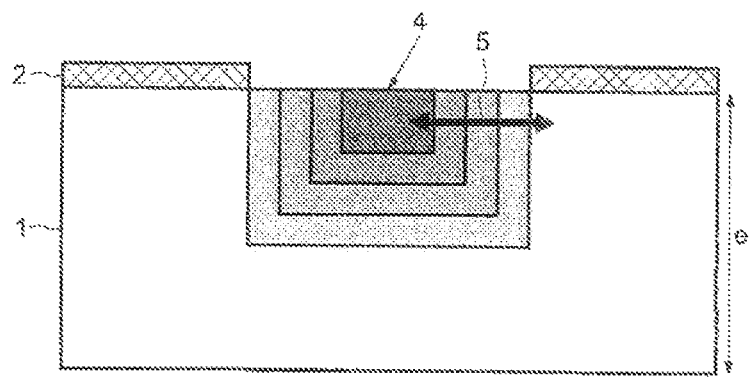

Successive layers 4 of a silicon and germanium alloy are deposited in the cavity 3 (FIG. 2). These layers are preferably deposited in a stratiform manner so as to closely follow the relief of the cavity 3. In order to obtain a gradient, the concentrations of silicon and germanium of the deposited layers are modified from one layer to the next. For example, it is possible to vary the fraction x of germanium from one layer to the next, x lying between 0 and 0.2. This clearly gives a horizontal gradient extending in the direction 5 perpendicular to the thickness e of the substrate. The nature of this gradient depends on how x varies relative to the thickness of the layers. This makes it possible to obtain, for example and in a non-limiting manner, a linear, exponential, parabolic or hyperbolic gradient. In addition, this gradient may have a horizontal direction or an oblique direction according to the aspect ratio given to the cavity 3.

An exemplary application of such a gradient is the obtaining of a sloping profile, for example convex or concave using an etching sensitive to the concentration of silicon or germanium.

The etching methods have a chemical character using an etching reactant attacking a type of material to be etched. If the concentration of this type varies in the material, the speed of etching also varies. This therefore gives a difference of etching speed over the length of the gradient. This variation of the etching speed makes it possible to generate a non-flat profile controlled by the etching conditions and by the concentration gradient.

To locally etch the alloy layers 4, it is possible to use, for example, a wet etching, a dry etching, a mechanical-chemical polishing, an oxidation, a high temperature etching with HCl or a combination of all or a part of these methods. This being so in the example of FIG. 2, an etching sensitive to the concentration of Ge has originated from a chemistry based on halide compounds, in particular fluorine and/or chlorine compounds. Those skilled in the art may also, for information, refer to the article that appeared in the magazine Microelectronic Engineering Volume 73-74, Issue 1 (June 2004) Pages 301-305.

In FIG. 2, the maximum concentration of germanium, corresponding to SiGe, is situated, for example, in the center of the cavity 3 filled with the successive layers 4. The germanium concentration decreases from one layer to the next up to the silicon of the substrate 1. According to the etching method, two results illustrated by FIGS. 3 and 4 can be envisaged. These two results depend on the chosen etching method.

If the speed of etching reduces with an increasing fraction of Ge in the SiGe alloy, the portion having a heavy concentration will be etched more slowly than the portion having a lighter concentration. This therefore gives FIG. 3.

If the speed of etching increases with an increasing fraction of Ge in the SiGe alloy, the portion having a heavy concentration will be more rapidly etched than the portion having a light concentration. This then gives FIG. 4.

In both cases, a non-flat etching profile is obtained.

Figure 5:
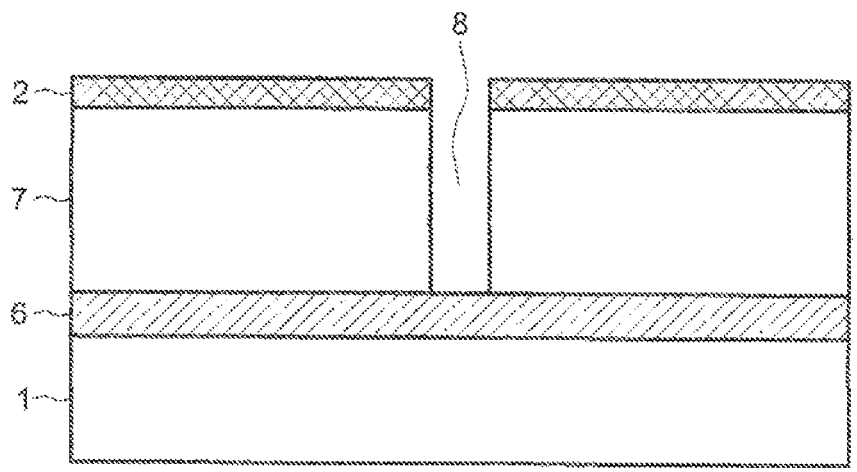
FIGS. 5 to 7 illustrate schematically steps of another embodiment making it possible to obtain a horizontal gradient.

FIG. 5 shows another embodiment. On a silicon substrate 1, an etch stop layer 6 is deposited. An etch stop layer has properties similar to a protective layer. Then a silicon layer 7 is deposited, followed by a protective layer 2 capable of protecting the silicon layer 7 when the cavity 8 is etched. An alternative could be to deposit a layer 7 of a material different from the material of the substrate 1.

Figure 6:
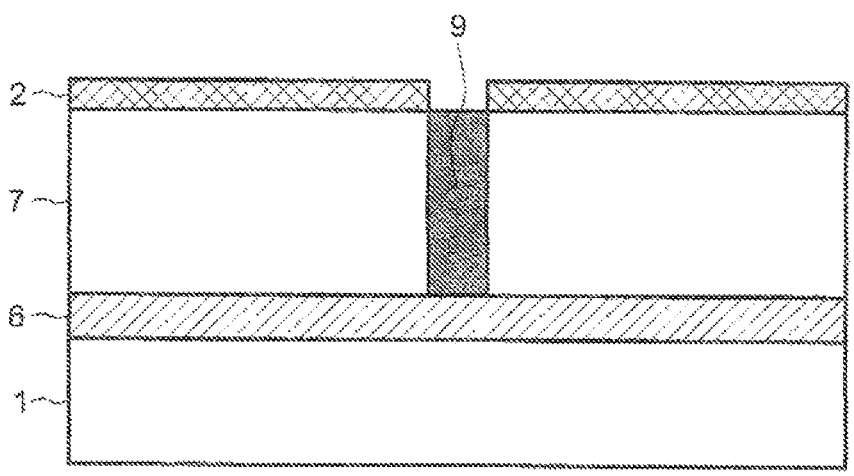
Figure 7:
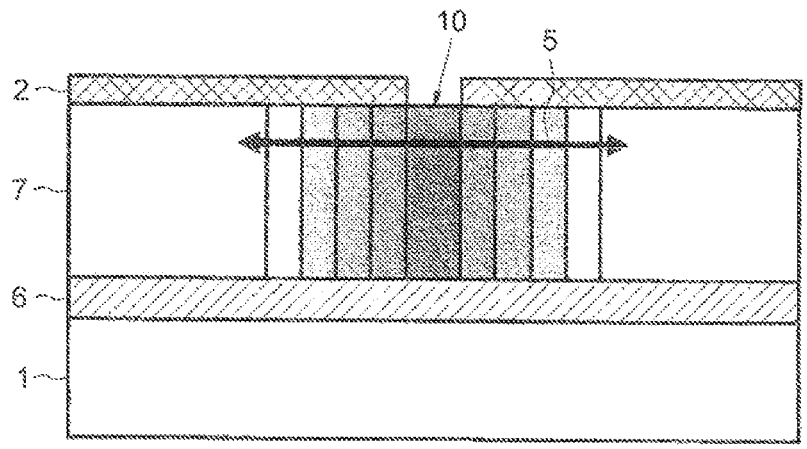

As can be seen in FIG. 6, the cavity 8 is filled with SiGe with a heavy germanium concentration, for example lying between 50 and 100% of Ge in order to obtain the structure 9. It is possible to use a selective deposit well known per se.

Then, a heat drive-in is carried out which makes it possible to stimulate the lateral diffusion of the germanium of the structure 9 in the silicon of the layer 7. Being limited in surface area by the protective layer and in depth by the etch stop layer 6, the heat diffusion of the germanium of the structure 9 takes place laterally. The control mechanisms and the reaction kinetics form part of the knowledge of those skilled in the art. In the case of diffusing the germanium in the silicon, the heat drive-in temperature lies between 900° C. and 1100° C. for a SiGe alloy having a 50% concentration of Ge. Generally, the heat drive-in temperature is limited by the melting temperature of the alloy richest in Ge. Here again, the direction 5 symbolizes the horizontal concentration gradient obtained.

Figure 8:
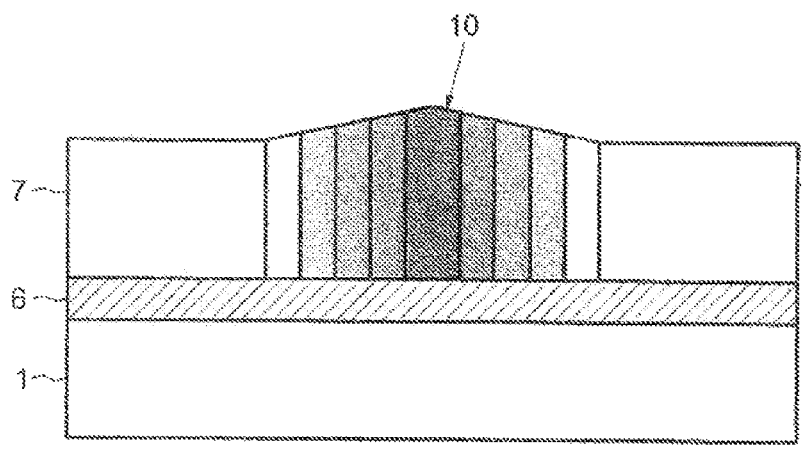
FIGS. 8 and 9 illustrate schematically examples of another embodiment of sloping etching.
Figure 9:
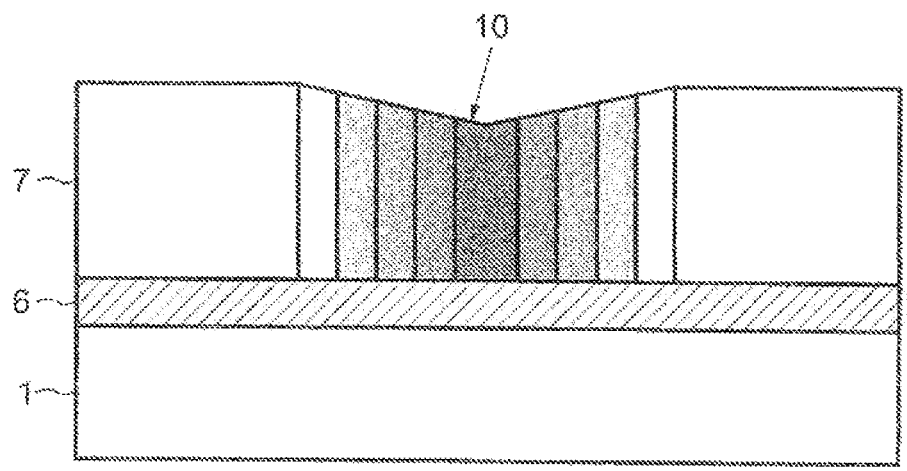

Here again, the device may be used directly or undergo an etching after retreatment of the layer 2. The reasoning is similar to that obtaining FIGS. 3 and 4. If the etching speed increases with an increasing fraction of Ge, the etching profile of FIG. 9 is obtained. If the etching speeds ratio is inverted, the profile of FIG. 8 is obtained.

What has just been described here may apply to different pairs of materials, for example Si, $SiO_x$, metals, As, Ga, etc.

Amongst the many possible applications of the method, the following can be cited as a non-limiting example.

Such a result may be used unchanged, for example for producing devices according to a geometry different from that which can be normally obtained in microelectronics. One example could be a sensor whose active portion would consist of a succession of layers perpendicular to the plane of the substrate. The various layers would be easy to access and to surface-connect.

Another application could be the production of dissymmetrical regions of source and of drain of MOS transistors, dissymmetrical for example in composition, in doping or in barrier height.

The difference of etching speed in a lateral concentration gradient will cause a sloping etching which, under control, leads to the formation of local surfaces for the subsequent increase of other materials (polar, piezo, etc.). For example, the increase of GaAs on Ge requires an orientation lying between 3 and 6° relative to a plane (100) of Ge, likewise with the increase of GaN on a plane of Si (100). Without using concentration gradients, it is necessary to use solid substrates that have a non-standard orientation and are therefore costly.

The etching speed difference in a lateral concentration gradient also makes it possible, when the gradient is buried, to etch a central portion more quickly than a peripheral portion, hence either to compensate for the difficulties of etching in high aspect ratios, or obtain inverted etching profiles directly.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method, comprising:
    forming a trench in a layer of a first material above an etch stop layer and a substrate;
    filling the trench with an alloy material comprising a combination of the first material and a second material, the second material being present in the alloy material with a heavier concentration than the first material; and
    performing heat drive-in to stimulate lateral diffusion of the second material from the alloy material filling the trench and into the first material in the layer within which the trench is formed so as to form a non-uniform composition in a direction substantially perpendicular to a depth of the trench.

2. A method comprising:
    forming a trench in a layer of a first material;
    filling the trench with an alloy material comprising a combination of the first material and a second material, the second material being present in the alloy material with a heavier concentration than the first material;
    performing heat drive-in to stimulate lateral diffusion of the second material from the alloy material filling the trench and into the first material in the layer within which the trench is formed so as to form a non-uniform composition in a direction substantially perpendicular to a depth of the trench; and
    etching a top surface of the deposited layers which fill the trench.

3. The method of claim 2 wherein the etching forms a top surface having one of a convex and concave profile.

4. The method of claim 1, wherein the first material is silicon and the second material is germanium.

5. A method for fabricating a semiconductive device with a concentration gradient, the method comprising:
    forming a cavity in a protective layer and a silicon layer above an etch stop layer and a substrate of the semiconductive device;
    filling of the cavity with an alloy; and
    performing a drive-in diffusion to form, in a portion of the silicon layer adjacent to the cavity, a gradient of a material from the alloy extending in a direction substantially perpendicular to the thickness of the semiconductive device.

6. The method of claim 5, wherein the material from the alloy is germanium.

7. The method of claim 6, wherein the gradient is a varying ratio of silicon to germanium as a function of distance from the cavity.

8. The method of claim 5, wherein the etch stop layer lies horizontally on top of the substrate and the silicon layer lies horizontally on top of the etch stop layer.

9. The method of claim 5, wherein forming the cavity comprises performing photolithography through a template of the protective layer and etching the silicon layer based on the template.

10. The method of claim 5, wherein the gradient comprises a continuous variation in ratio of the alloy to material of the silicon layer as a function of horizontal distance.

11. The method of claim 5, further comprising etching a top surface of the alloy and the diffused portion of the silicon layer adjacent to the cavity to form a convex or concave surface.

12. A semiconductive device comprising:
    a substrate;
    an insulating etch stop layer over the substrate;
    a silicon layer over the insulating etch stop layer, wherein the silicon layer has a cavity filled with an alloy;
    a first region of the alloy and a second region in the silicon layer laterally adjacent to the first region; and
    wherein the second region includes a gradient of material driven from the alloy in the cavity to diffuse into the second region extending in a direction substantially perpendicular to the thickness of the semiconductive device.

13. The device according to claim 12, wherein the alloy comprises germanium and the gradient of material in the second region comprises a variation of germanium concentration.

14. The device according to claim 13, wherein the gradient is a varying ratio of silicon to germanium as a function of distance from the cavity.

15. The device according to claim 12, wherein the insulating layer lies horizontally on top of the substrate and the silicon layer lies horizontally on top of the insulating layer.

16. The device according to claim 12, wherein the gradient is produced by heat diffusing the first region of the alloy into the second region in the silicon layer.

17. The device according to claim 12, wherein the cavity is formed by performing photolithography through a template of a protective layer disposed over the silicon layer and etching the silicone layer based on the template.

18. The device according to claim 12, wherein the gradient comprises a continuous variation in ratio of the alloy to material of the silicon layer as a function of horizontal distance.

19. The device according to claim 18, wherein the continuous variation in ratio of the alloy to material of the silicon layer allows the gradient to be etched at a continuously varying rate to form a concave or convex profile.

* * * * *